(12) United States Patent
Anand

(10) Patent No.: US 7,120,412 B2
(45) Date of Patent: Oct. 10, 2006

(54) CALIBRATION CIRCUIT FOR VCO

(75) Inventor: Seema Butala Anand, Beverly Hills, CA (US)

(73) Assignee: Broadcom Corporation, Irvine, CA (US)

( * ) Notice: Subject to any disclaimer, the term of this patent is extended or adjusted under 35 U.S.C. 154(b) by 566 days.

(21) Appl. No.: 10/303,384

(22) Filed: Nov. 25, 2002

(65) Prior Publication Data

US 2003/0224747 A1    Dec. 4, 2003

Related U.S. Application Data

(60) Provisional application No. 60/384,736, filed on May 31, 2002.

(51) Int. Cl.
*H04B 1/06* (2006.01)
*H04B 1/16* (2006.01)

(52) U.S. Cl. .............. 455/260; 455/208; 455/262; 375/327

(58) Field of Classification Search ........... 455/205, 455/208, 255, 260, 262, 334; 331/1 R, 16, 331/18, 34, 117 R; 375/329, 327
See application file for complete search history.

(56) References Cited

U.S. PATENT DOCUMENTS

| | | | | |
|---|---|---|---|---|
| 6,028,488 A * | 2/2000 | Landman et al. | ............. | 331/34 |
| 6,137,372 A * | 10/2000 | Welland | ................. | 331/117 R |
| 6,549,764 B1 * | 4/2003 | Welland | ..................... | 455/260 |
| 6,606,004 B1 * | 8/2003 | Staszewski et al. | ........... | 331/17 |
| 6,670,861 B1 * | 12/2003 | Balboni | ...................... | 375/308 |
| 6,774,736 B1 * | 8/2004 | Kwek et al. | ............ | 331/117 R |

* cited by examiner

*Primary Examiner*—Quochien B. Vuong
(74) *Attorney, Agent, or Firm*—Garlick Harrison & Markison; James A. Harrison

(57) ABSTRACT

A phase-locked loop circuit includes an array of selectable capacitors formed within the phase-locked loop circuit to enable the phase-locked loop circuit to provide a degree of coarse frequency control by adding or removing capacitors and a degree of fine frequency control by sinking or sourcing current from a charge pump into a loop filter. A finite state machine is provided within a voltage controlled oscillator calibration circuit that communicates with an external baseband processor to initiate a calibration process, and further to determine how many capacitors of an array of capacitors if formed within the phase-locked loop circuit should be coupled to provide the coarse frequency control.

21 Claims, 12 Drawing Sheets

| CALIBRATION OUTPUT SETTINGS ||
|---|---|
| VOLTAGE LOW | VOLTAGE HIGH |
| 1000 | 1000 |
| 1100 | 0100 |
| 1110 | 0010 |
| 1111 | 0001 |

CALIBRATION CIRCUIT FOR VCO

CROSS-REFERENCE TO RELATED APPLICATIONS

This Application claims benefit of U.S. Provisional Application No. 60/384,736, filed on May 31, 2002, and entitled "Calibration Circuit for VCO," which is incorporated herein by reference.

BACKGROUND

1. Field of the Invention

This invention relates generally to wireless communications and, more particularly, to the operation of a Radio Frequency (RF) transceiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscribers' subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF transceivers. Radio frequency transceivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts the RF signal to an IF signal and then converts the IF signal to a baseband signal. In other systems, the received RF signal is converted directly to a baseband signal.

In converting the RF signal to an IF signal, the RF signal is mixed with a signal having a specified frequency that is received from a local oscillator (LO). As used herein, "local oscillator" is a generic term used to describe a device that provides a fixed frequency to a mixer that the mixer mixes with a signal of interest, e.g., baseband signal, RF signal, or IF signal. Because the mixer's ability to down convert (or up convert) a received signal depends upon it receiving an accurate frequency signal from the local oscillator, many local oscillators are formed to be adjustable so as to adjust an output frequency to a number of supported RF channels and to account for variations due to temperature, process, manufacturing and other factors that may affect the precise frequency that is produced by the local oscillator.

RF transceivers typically operate across relatively large RF frequency range with tight operating tolerance. These operating requirements, as well as the process and environmental variations described above, place substantial burden on the PLL. As is known by one of average skill in the art, a voltage controlled oscillator (VCO) produces a signal having a frequency characteristic that is a function of an input voltage level of the VCO. A VCO is often formed within a typical PLL to produce signals having a large frequency range for a large range in input voltage levels to create a PLL that is sufficiently adjustable to account for the process and environmental variations. However, VCOs operate best, i.e., are most linear, within small frequency ranges. Thus, when a standard PLL is required to operate across a large frequency range, the VCO often operates in at least a non-linear region. In this/these non-linear regions of operation, the VCO produces significant phase noise which degrades the LO signal produced by the PLL and, resultantly, degrades the IF signal (or baseband signal) produced by the coupled mixer.

Because the variations due to the environmental and process factors can be quite large, however, it is often required that the local oscillator be adjustable over a large range. If, for example, a voltage controlled oscillator is often required to have an ability to provide frequencies of oscillation that correspond to a large input voltage range in order to provide the necessary frequency compensation to fine tune the voltage controlled oscillator to account for environmental variations, etc. Thus, increasing frequency range requirements for a PLL increases probably phase noise and decreases performance of a phase-locked loop that is being used to provide a signal having a specified frequency characteristic of the mixer. Thus, what is needed is a circuit that reduces the required gain level for the voltage controlled oscillator and therefore reduces any introduced phase noise while accurately producing a signal with a specified frequency.

SUMMARY OF THE INVENTION

In order to overcome the shortcomings described above, a radio receiver constructed according to the present invention includes a voltage controlled oscillator and voltage controlled calibration circuit that provide coarse frequency adjustment for the VCO to facilitate the use of a VCO with a limited gain that produces less phase noise. Specifically, the receiver of the present invention includes a VCO calibration circuit that provides a calibration output that prompts a phase-locked loop (PLL) to selectively couple capacitors formed within the PLL to adjust a frequency of oscillation produced by the VCO formed within the PLL. The selective capacitors formed within the PLL are coupled to an output node of the PLL in the described embodiment of the invention to alter the operation of the VCO such that their introduction/removal changes the operating characteristics of the VCO.) Accordingly, the VCO calibration circuit provides for a coarse level of frequency tuning thereby enabling a VCO formed within the PLL to be required to provide only a fine degree of tuning.

Along these lines, a finite state machine adjusts the VCO frequency to the most linear portion of the PLL control voltage range. Once the baseband processor initiates the VCO calibration cycle, the finite state machine implements a binary search algorithm to digitally control a PLL tuning capacitor bank thereby changing the PLL output frequency. A VCO control voltage is provided to a first input of a plurality of comparators (four comparators in the described embodiment) and a threshold voltage is provided to a second comparator input of the plurality of comparators. The 4-bit output of the plurality of comparators of one embodiment of the present invention is provided to the finite state machine. The finite state machine examines the comparator output to determine if the VCO input voltage is within an ideal range and sets the digital capacitor bank accordingly. The process continues until the control voltage is within the ideal range or as close as possible. A plurality of control lines provides communication between the finite state machine and a baseband processor. The baseband processor provides control commands to the finite state machine while the finite state machine provides status signals to the baseband processor.

With the present invention, the frequency tuning occurs in one of two different circuit portions. First, a charge pump and a loop filter provide fine degree of adjustment of the voltage input to the voltage controlled oscillator and therefore provide fine tuning of the frequency of oscillation of the voltage controlled oscillator. Additionally, the present invention provides for a second circuit portion for tuning the frequency of oscillation, which second portion includes the VCO calibration circuit that further includes a finite state machine defining calibration logic. The second circuit portion includes a capacitor bank formed within the PLL circuit that is coupled to and controlled by the VCO calibration circuit. The VCO calibration circuit and the capacitor bank provide the coarse level of tuning that therefore enable the fine tuning to be left to the combination of the charge pump and loop filter and the VCO internal varactor. As such, a VCO with a limited gain may be implemented thereby reducing phase noise and increasing signal quality.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

FIG. 6 is a table that illustrates one method for adjusting a frequency produced by a voltage controlled oscillator according to one embodiment of the present invention;

DETAILED DESCRIPTION OF THE DRAWINGS

Figure 1A:
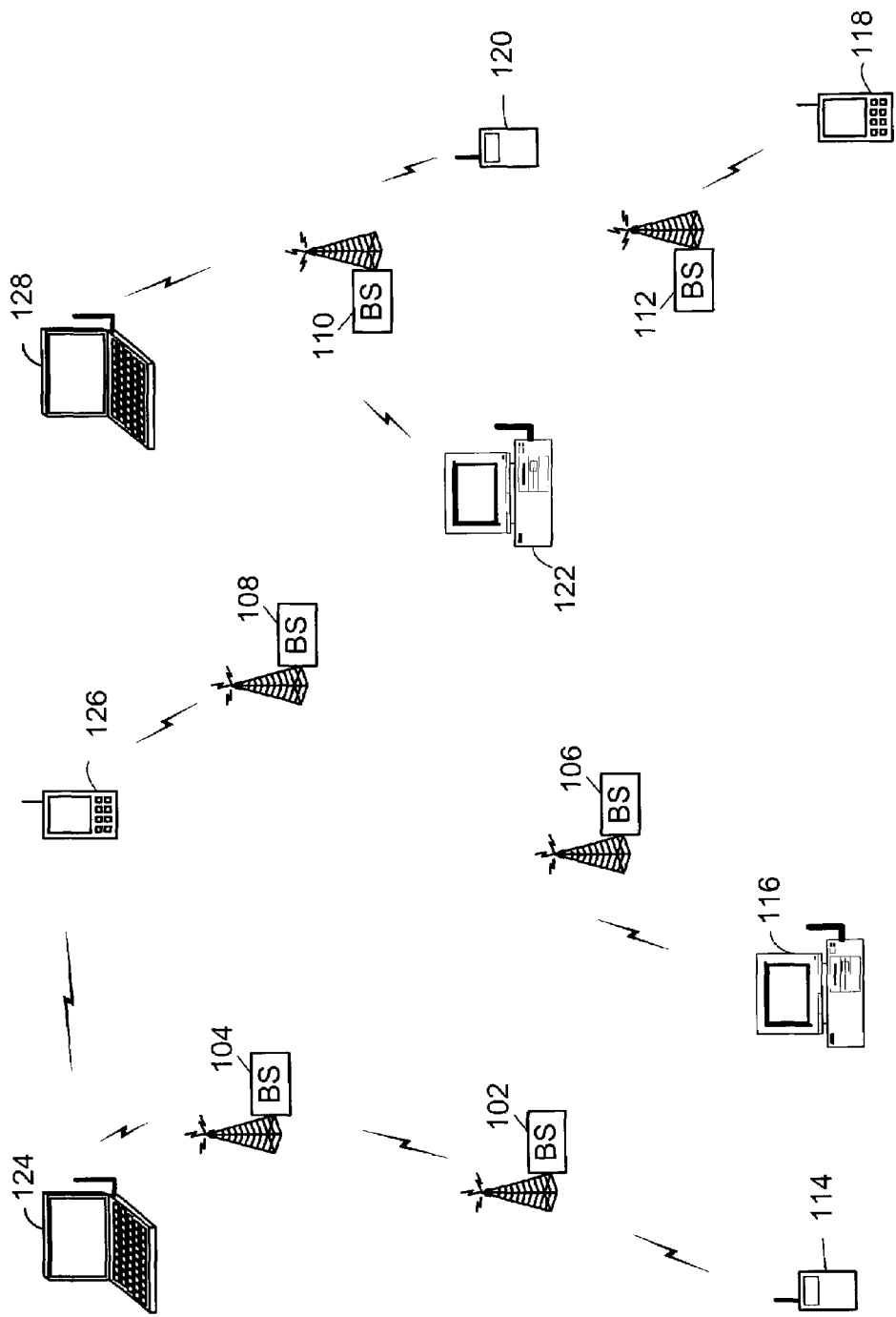
FIG. 1A is a system diagram illustrating a cellular system within which the present invention is deployed.

FIG. 1A is a system diagram illustrating a cellular system within which the present invention is deployed. The cellular system includes a plurality of base stations 102, 104, 106, 108, 110, and 112 that service wireless communications within respective cells, or sectors. The cellular system services wireless communications for a plurality of wireless subscriber units. These wireless subscriber units include wireless handsets 114, 118, 120, and 126, mobile computers 124 and 128, and desktop computers 116 and 122. During normal operations, each of these subscriber units communicates with one or more base stations during handoff among the base stations 102 through 112. Each of the subscriber units 114 through 128 and base stations 102 through 112 include RF circuitry constructed according to the present invention.

The RF circuitry formed according to the present invention may be formed to operate with any one of a number of different protocols and networks. For example, the network of FIG. 1A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth transceiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 1A. For example, wireless networks that comport with service premises-based Wireless Local Area Network (WLAN) communications, e.g., IEEE 802.11a and IEEE 802.11b communications, and ad-hoc peer-to-peer communications, e.g., Bluetooth (as described above). In a WLAN system, the structure would be similar to that shown in FIG. 1A, but, instead of base stations 102 through 112, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF transceiver of the present invention would support communications between peer devices, e.g., mobile computer 124 and wireless handset device 126. The fast growth of the mobile communications market and for networks as shown in FIG. 1A require the development of multi-band RF transceivers that are small in size, low in cost, and have low power consumption. These RF transceivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses GFSK modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on BPSK and QPSK constellations at 11 bps. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 1A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receive and transmission circuitry that have full functionality while meeting these lower power constraints and while providing good signal quality. The system of FIGS. 1A and 1B include the inventive phase-locked loop which provides a desired frequency signal while reducing the amount of phase noise that often are introduced into the modulated channels.

Figure 1B:
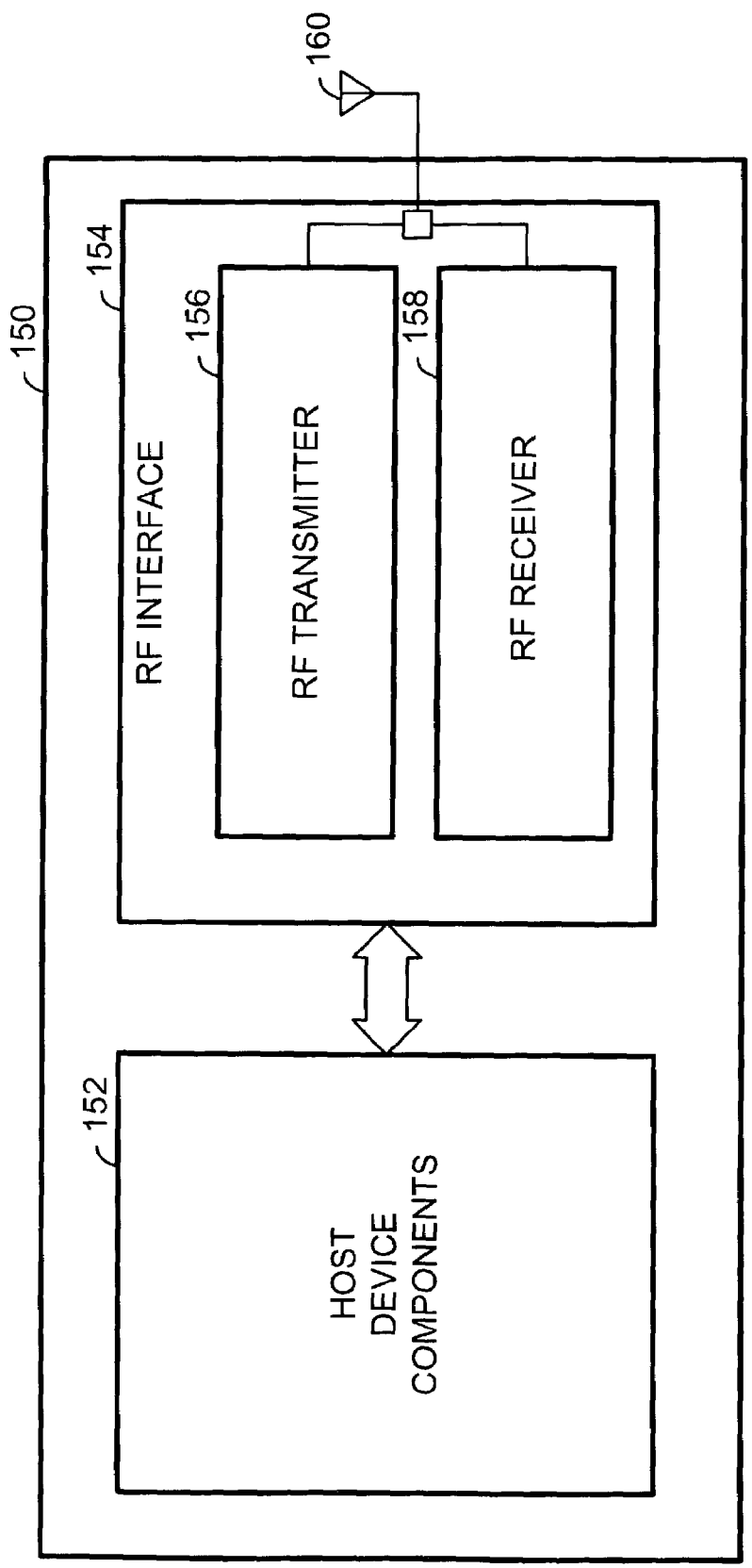
FIG. 1B is a block diagram generally illustrating the structure of a wireless device constructed according to the present invention.

FIG. 1B is a block diagram generally illustrating the structure of a wireless device 150 constructed according to the present invention. The general structure of wireless device 150 will be present in any of wireless devices 114 through 128 illustrated in FIG. 1A. Wireless device 150 includes a plurality of host device components 152 that service all requirements of wireless device 150 except for the RF requirements of wireless device 150. Of course, operations relating to the RF communications of wireless device 150 will be partially performed by host device components 152.

Coupled to host device components 152 is a Radio Frequency (RF) interface 154. RF interface 154 services the RF communications of wireless device 150 and includes an RF transmitter 156 and an RF receiver 158. RF transmitter 156 and RF receiver 158 both couple to an antenna 160. One particular structure of a wireless device is described with reference to FIG. 2. Further, the teachings of the present invention are embodied within RF transmitter 156 of RF interface 154.

The RF interface 154 may be constructed as a single integrated circuit. However, presently, the RF interface 158 includes an RF front end and a baseband processor. In the future, however, it is anticipated that many highly integrated circuits, e.g., processors, system on a chip, etc., will include an RF interface, such as the RF interface 154 illustrated in FIG. 1B. In such case, the receiver structure of the present invention described herein may be implemented in such devices.

Figure 2:
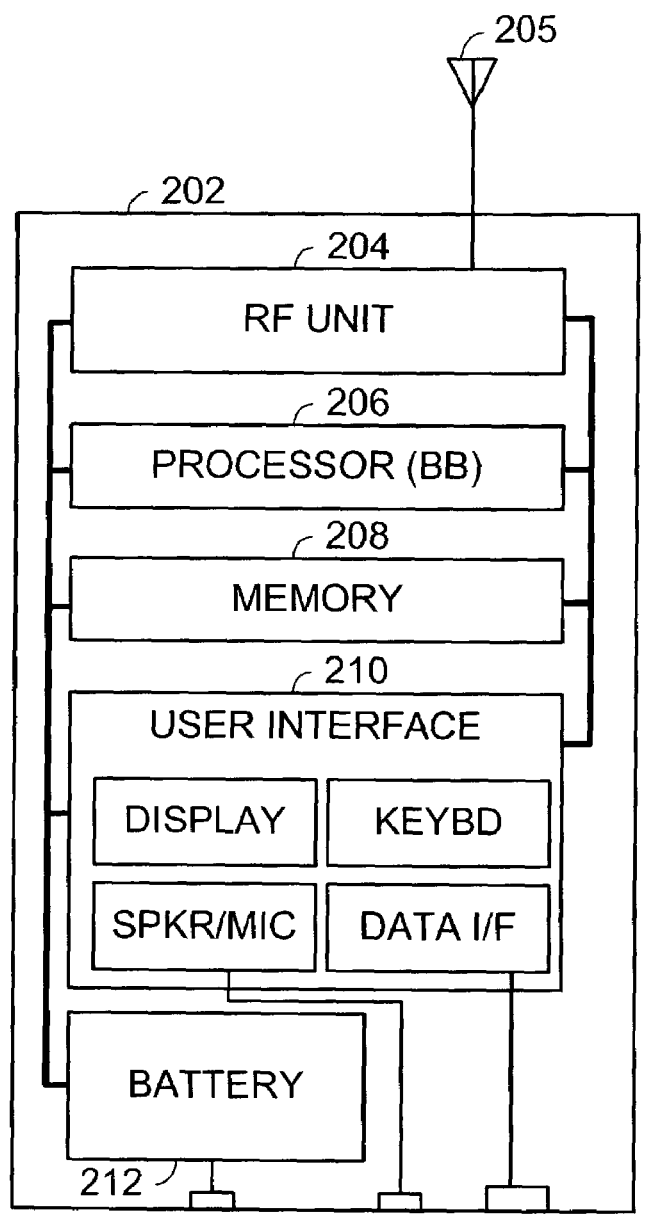
FIG. 2 is a block diagram illustrating a subscriber unit constructed according to the present invention.

FIG. 2 is a block diagram illustrating a subscriber unit 202 constructed according to the present invention. Subscriber unit 202 operates within a cellular system, such as the cellular system described with reference to FIG. 1A. Subscriber unit 202 includes an RF unit 204, a processor 206 that performs baseband processing and other processing operations, and a memory 208. RF unit 204 couples to an antenna 205 that may be located internal or external to the case of subscriber unit 202. Processor 206 may be an Application Specific Integrated Circuit (ASIC) or another type of processor that is capable of operating subscriber unit 202 according to the present invention. Memory 208 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 208 may be partially or fully contained upon an ASIC that also includes processor 206. A user interface 210 includes a display, a keyboard, a speaker, a microphone, and a data interface, and may include other user interface components, as well. RF unit 204, processor 206, memory 208, and user interface 210 couple via one or more communication buses or links. A battery 212 is coupled to, and powers, RF unit 204, processor 206, memory 208, and user interface 210.

RF unit 204 includes the RF transceiver components and operates according to the present invention to adjust the frequency of a phase locked-loop in a manner that reduces phase noise. More specifically, RF unit 204 includes the inventive phase-locked loop as described herein that facilitates the use of a voltage controlled oscillator that has a reduced gain and therefore produces lower amounts of phase noise. The structure of subscriber unit 202, as illustrated, is only one particular example of a subscriber unit structure. Many other varied subscriber unit structures could be operated according to the teachings of the present invention. Further, the principles of the present invention may be applied to base stations, as are generally described with reference to FIG. 1A.

Figure 3:
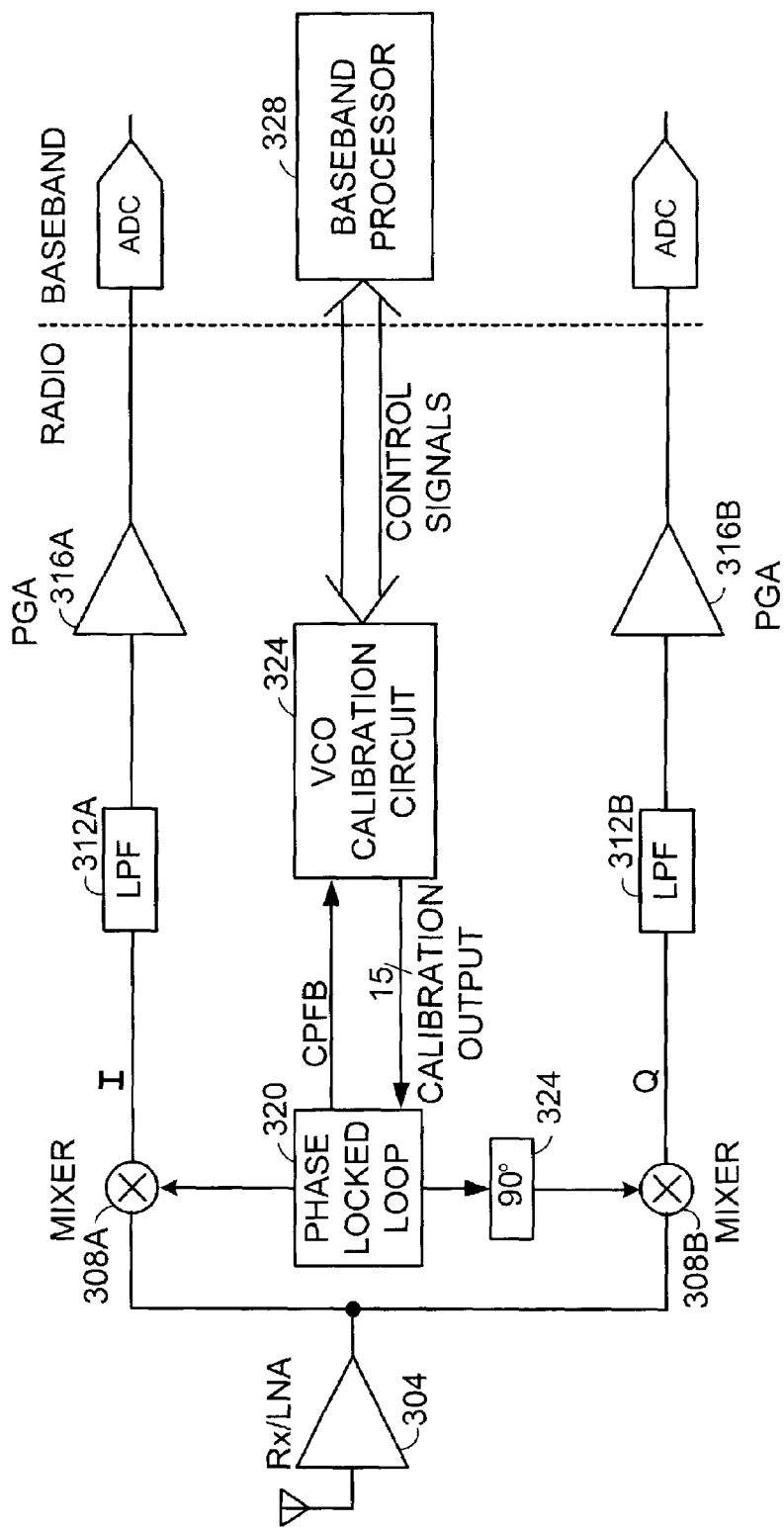
FIG. 3 is a functional schematic block diagram of an RF processing unit of a radio receiver implemented according to one embodiment of the present invention.

FIG. 3 is a functional schematic block diagram of an RF processing unit of a radio transceiver implemented according to one embodiment of the present invention. An RF receiver unit includes a receiver/low noise amplifier (LNA) 304 that is coupled to receive wireless radio communications by way of an antenna. As is known by those of average skill in the art, radio communications typically employ one of many different modulation techniques, including Quadrature Phase Shift Keying (QPSK), et al. Accordingly, receiver/LNA 304 produces an amplified signal containing I and Q modulated channels to mixers 308A and 308B for separation into the I and Q modulated channels.

In the described embodiment of the invention, the radio transceiver is formed to satisfy 802.11b design requirements. Accordingly, at any time, the RF input signal is centered on a particular RF channel within the 2.4 GHz carrier frequency band. The RF input signal then is down converted to a baseband signal.

The mixers 308A and 308B both receive the RF input signal from receiver/LNA 304. Mixers 308A and 308B also receive I and Q phases, respectively, of an LO signal having a specified frequency component from phase-locked loop circuit 320. Mixer 308B, as may be seen, receives the Q phase of the LO signal from phase-locked loop circuit 320 by way of a phase shift circuit 324 that provides a 90° phase shift to the LO signal. Accordingly, mixer 308B produces the Q component of the baseband signal, while mixer 308A produces the I component of the baseband signal. Thereafter, mixers 308A and 308B provide the I and Q components of baseband signal to low pass filters 312A and 312B for the I and Q modulated channels, respectively.

Phase-locked loop circuit 320, besides producing the LO signal, further is coupled to provide a charge pump feedback bias (CPFB) signal to a VCO calibration circuit 324. VCO calibration circuit 324, responsive thereto and to control signals received from an external baseband processor 328, determines and provides a 15-bit calibration output signal back to phase-locked loop circuit 320. Phase-locked loop circuit 320, in turn, selectively couples capacitors to the output of the VCO of the PLL based upon the values of the calibration output signal received from VCO calibration circuit 324 to provide a coarse degree of frequency calibration as is described in relation to FIG. 4.

After the frequency calibration has been adjusted to a coarse degree, phase-locked loop circuit 320 provides fine frequency adjustment by increasing or decreasing the current produced from an internal charge pump that is fed into a loop filter and, therefore, a voltage that is produced as an input to a voltage controlled oscillator (conventional PLL operations). Varying the voltage produced to a voltage controlled oscillator affects the output of an internal varactor and therefore the VCO frequency of oscillation, as is known by one of average skill in the art. The output signals are then produced to mixers 308A and 308B. The output of mixers 308A and 308B then include the I and Q modulated channels, respectively.

The I and Q components of the baseband signal produced by mixers 308A and 308B are then fed into low pass filters 312A and 312B, respectively. After the I and Q components of the baseband signal are produced to low pass filters 312A and 312B, respectively, the filtered output of the low pass filters 312A and 312B is produced to amplification circuitry, for example, programmable gain amplifiers 316A and 316B of FIG. 3. The output of the programmable gain amplifiers 316A and 316B is then produced from the integrated circuit radio circuitry to an external baseband processor in the described embodiment of the invention. The external baseband processor includes analog-to-digital converter circuitry for converting the amplified signals received from the programmable gain amplifiers 316A and 316B into digital form where they may be interpreted and processed. As will be explained in greater detail below, besides perform its convention operations, baseband processor 328 of FIG. 3 generates control signals on a plurality of control lines to VCO calibration circuit 324 that initiate and control calibration of the capacitor bank and, therefore, the frequency of operation (coarse) of phase-locked loop circuit 320.

Figure 4:
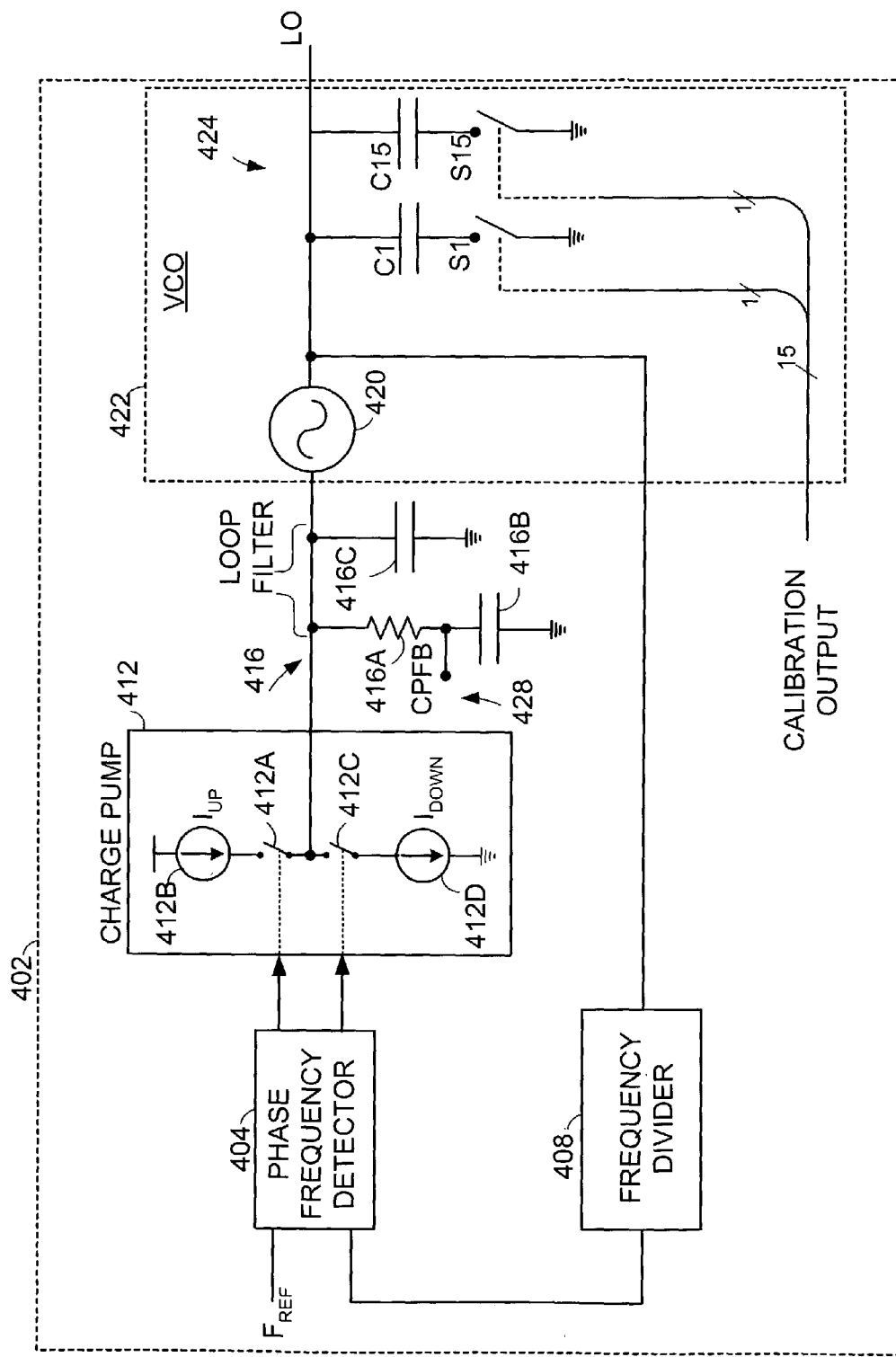
FIG. 4 is a functional schematic block diagram illustrating the phase-locked loop circuit formed according to one embodiment of the present invention.

FIG. 4 is a functional schematic block diagram illustrating the phase-locked loop circuit formed according to one embodiment of the present invention. A PLL 402 includes a phase frequency detector, a charge pump, a loop filter, a voltage controlled oscillator and a frequency divider in a feedback loop. A phase-locked loop is a feedback system that is used to maintain an output signal in a specific frequency or phase relationship with a reference signal. Phase-locked loops are used in many areas of electronics to produce an output signal at a frequency that is a multiple of the frequency of the input signal. The frequency multiple may be an integer multiple or alternatively, as with the PLL 402, the output frequency is not at an integer multiple of the frequency of the input signal. This type of PLL 402 is referred to as a fractional-N PLL. These applications include frequency synthesizers, analog and digital modulators and demodulators, and clock recovery circuits. The phase detector 404 is a device that produces an output voltage that reflects a phase difference of two input signals. A voltage controlled oscillator (VCO) 422 is a circuit that produces an AC output signal whose frequency is a function of the input control voltage and includes, in the described embodiment, a varactor 420 and an array of capacitors 424. The frequency divider is a device that produces an output signal whose frequency is an integer division of the input signal frequency. The inventive PLL 402 includes a VCO 422 that is formed within the PLL circuitry to include, in the described embodiment, a varactor 420 and an array of selectable capacitors shown generally at 424 to provide external control of an output frequency of operation. As may be seen the loop filter 416 is a circuit that filters the output of the phase detector 404 and charge pump 412 to stabilize the dynamics and performance of the system. In general, the loop filter comprises a low pass filter and is used in a PLL to convert the current output of a current source (charge pump) to a voltage that is provided to the VCO. The voltage controlled oscillator sets a frequency of oscillation based upon a voltage level established by the loop filters. The loop filter shapes the overall response of the phase-locked loop to meet the design goals of the system. Loop filters may be formed either from passive components or active components similar to other filters.

In operation, phase frequency detector 404 receives a reference frequency from a frequency source, for example, a crystal formed to operate at 1 MHz. Phase frequency detector 404 further is coupled to receive an output of the frequency divider 408 that is coupled within a feedback loop from an output of phase-locked loop circuit 320. Phase frequency detector 404 compares the output received from frequency divider 408 to the reference frequency that it received from a crystal or other frequency source and produces a signal that reflects the difference in frequency (or phase) of the two received signals. In the described embodiment, two control signals are produced to a charge pump 412. A first control signal prompts a switch 412A within charge pump 412 to close to source current from current source 412B into a loop filter shown generally at 416. A second control signal prompts switch 412C to close to sink current from loop filter 416 into current sink 412D. Sinking current from loop filter 416 lowers an input voltage to varactor 420 while sourcing current into loop filter 416 increases the input voltage of varactor 420.

As may be seen, loop filter 416 comprises a resistor 416A that is coupled in series with a capacitor 416B. The series combination of resistor 416A and capacitor 416B is coupled in parallel to capacitor 416C. A node is defined between resistor 416A and capacitor 416B from which a charge pump feedback bias (CPFB) signal is produced for use by a voltage controlled oscillator calibration circuit, such as voltage controlled oscillator calibration circuit 324 of FIG. 3.

Because charge pump 412 produces a DC current, capacitors 416C and 416B build up charge to the DC voltage level. Accordingly, the charge pump feedback bias signal extracted from node 428 reflects the DC voltage level transmitted from charge pump 412 once capacitors 416C and, more significantly, 416B have had adequate time to charge.

Voltage controlled oscillator 422 receives the DC voltage level from loop filter 416 and generates a frequency signal that corresponds to the input voltage as is known by one of ordinary skill in the art. More specifically, the current produced by charge pump 412 initially is conducted to capacitors 416B and 416C to charge them. Once the capacitors are charged, the voltage across the loop filter is input into voltage controlled oscillator 422. Charge pump 412, therefore, may adjust the output frequency of voltage controlled oscillator 422 either by sourcing current into loop filter 416 thereby increasing the voltage level that is produced to voltage controlled oscillator 422, or by sinking current from loop filter 416 thereby decreasing the voltage level and, correspondingly, decreasing the output frequency from voltage controlled oscillator 422.

As was described above, charge pump 412 is operable to fine tune the output frequency of voltage controlled oscillator 422 by increasing or decreasing the input voltage to the voltage controlled oscillator by, respectively, increasing or decreasing the amount of charge current. A voltage controlled oscillator 422 includes an internal varactor 420 that changes its internal capacitance, by a specified degree, in response to the changes in voltage that it receives from the charge pump and loop filter. This change in capacitance therefore affects the output frequency of the signal from the voltage controlled oscillator 422. In many prior art systems, voltage controlled oscillators used in place of voltage controlled oscillator 422, are formed to have the ability to provide significant increases and decreases in the capacitance of the internal varactor 420 in response to a wide range of input voltages received from the combination of charge pump 412 and loop filter 416.

In the described embodiment of the invention, varactor 420 is formed to have a much smaller range of capacitance values compared to VCOs used in prior art phase-locked loop circuits and therefore has a smaller output range of frequency values. The use of voltage controlled oscillator 422 with a limited range and with an internal varactor that can only produce capacitance changes within a limited range is advantageous in that phase noise is decreased. The output of phase-locked loop 320 is then fed into an array of capacitors, shown generally at 424, that are used, with control signals, to provide coarse tuning of an oscillation frequency during a calibration mode. In the example of FIG. 4, as may be seen, 15 capacitors are coupled in parallel, each coupled in series with a digital switch.

Figure 5:
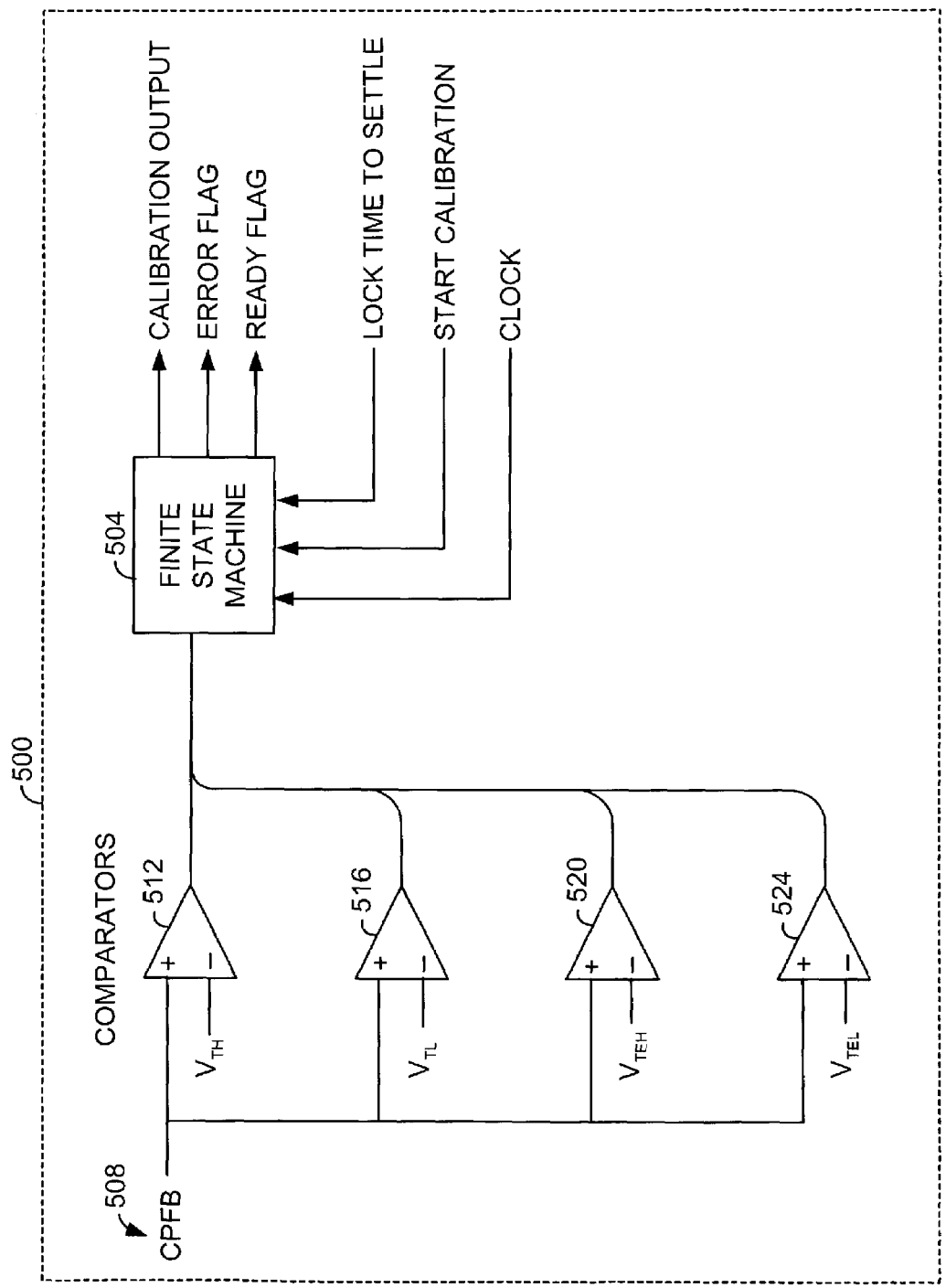
FIG. 5 is a schematic diagram of a finite state machine and associated logic circuitry according to one embodiment of the present invention.

FIG. 5 is a schematic diagram of a VCP calibration circuit further including a finite state machine and associated logic circuitry according to one embodiment of the present invention. VCO calibration circuit 500 includes a plurality of comparators are all coupled to receive a charge pump feedback bias signal 508 for comparison to a plurality of threshold voltage levels. The charge pump feedback bias signal 508 may be sampled as shown in FIG. 4 or in an alternate method according to design preference. In the described embodiment of the invention, four comparators 512, 516, 520 and 524 each receive the charge pump feedback bias signal 508 at a positive terminal for comparison to one of four specified voltage levels that are received at a negative terminal. More specifically, comparator 512 further is coupled to receive at its negative terminal, a high threshold voltage level, while comparator 516 receives a low threshold voltage level at its negative terminal. Comparators 520 and 524 receive high and low error threshold voltage level, respectively. The outputs of comparators 512, 516, 520 and 524 are produced to a finite state machine 504. Finite state machine 504 further is coupled to receive control signals from an external source. Finite state machine 504 comprises logic circuitry formed using any one of a plurality of designs and technologies, including ASIC designs, field programmable gate array design (FPGA) and general purpose processor technology whose operational logic is defined by software. In general, however, finite state machine 504 is formed to define operational logic that is disclosed herein in the description of its operation.

In the described embodiment of the invention, finite state machine 504 is coupled to receive at least three control signals from an external baseband processor. The three control signals include a "lock time to settle" signal which is set according to whether sufficient time has elapsed since a last calibration step, meaning that capacitors were switched in or out of coupling to affect the voltage controlled oscillator frequency. Finite state machine 504 further receives a second control signal, labeled "start calibration", that defines when the finite state machine and, more specifically, the voltage calibration circuit and phase-locked loop are to attempt to calibrate the circuit by switching capacitors in and out of coupling to obtain a desired output frequency from the voltage controlled oscillator. Finally, finite state machine 504 is coupled to receive a clock signal from the baseband processor for defining circuit timing as is known by one of ordinary skill in the art.

Finite state machine 504 further generates three sets of signals. First, it generates a ready flag to indicate that the charge pump feedback bias signal is "close enough" to a desired value, meaning that calibration is complete. In general, the high threshold and low threshold voltage levels that are received by comparators 512 and 516, define a desired linear voltage range for the selected output frequency of oscillation of the voltage controlled oscillator. Thus, if comparators 512 and 516 generate a logic 1, the voltage level being output from the combination of the charge pump and loop filter, for example, charge pump 412 and loop filter 416, is higher than the high voltage limit. If, on the other hand, comparators 512 and 516 produce a logic 0, then the voltage level being produced by the combination of the charge pump and loop filter is lower than the low voltage threshold.

If, on the other hand, comparator 516 produces a logic 1, while comparator 512 produces a logic 0, then the output voltage from the charge pump and loop filter are within a range defined by the threshold high and threshold low voltages. Finite state machine 504, upon receiving a logic 0 from comparator 512 and a logic 1 from comparator 516 generates an indication of "READY" on the ready flag (control line) that the calibration is complete and the phase-locked loop is ready for normal operation.

Finite state machine 504, in the described embodiment of the present invention, does not analyze and respond to the logic values produced by comparators 520 and 524 until either the calibration is complete, meaning that a logic 0 and logic 1 was received from comparators 512 and 516, respectively, or, alternatively, the calibration output has set all the possible combinations of capacitance and has never received an indication that the voltage is within the ranges defined by the high threshold voltage value and the low threshold voltage value (as specified by comparators 512 and 516 in one embodiment of the invention). In another embodiment, all four comparator output values are evaluated every time at least one capacitor's selective coupling is either coupled or decoupled from the phase-locked loop circuit. In such a condition, finite state machine 504 generates an error indication on the output control line indicated shown as error flag here in FIG. 5.

Generally, finite state machine (FSM) 504 sends and receives control signals to a baseband processor. Upon receipt of a start calibration signal, the FSM starts a VCO calibration algorithm. Charge pump feedback bias signal 508 that reflects an input voltage to a VCO is provided to a first input of a plurality of comparators 512–524. While it is understood, by those of average skill in the art, that the number of comparators will depend on the number of bits required by the finite state machine 508, the present embodiment of the invention only utilizes four bits. A second input on each comparator receives a unique threshold voltage selected to define the desired operating range of the VCO control voltage. The comparator outputs are coupled to the FSM input. After a specified settling time has elapsed, the FSM algorithm determines if the CPFB voltage is within the threshold voltage limits and then either sets a calibration ready flag, continues calibration, or sets an error flag.

FIG. 6 is a table that illustrates one method for adjusting a frequency produced by a voltage controlled oscillator according to one embodiment of the present invention. As was shown in relation to FIGS. 4 and 5, the present invention includes an array of capacitors in a capacitor bank that are controlled by a finite state machine that provides a calibration output to selectively couple capacitors into coupled connections in a phase-locked loop circuit. The table of FIG. 6 further illustrates the logic for setting the calibration output signal produced by the finite state machine, for example, finite state machine 504 of FIG. 5, to select the number of capacitors of the capacitor bank, for example, capacitor bank 424 of FIG. 4, that are to be coupled into the circuit according to one embodiment of the present invention.

As may be seen, the table of FIG. 6 includes columns 604 and 608 that list the numbers, in digital, of capacitors that are to be coupled at one time and the adjustment step sizes according to whether capacitance is to be increased (column 604) or decreased (column 608). More specifically, row 612 illustrates the starting value of the calibration output that is produced by finite state machine 504, for the circuit of FIG. 5, when the start calibration signal is received by finite state machine 504. In general, a starting capacitance value is approximately a middle value that results from approximately one-half of the selectable capacitors being selectively coupled to the PLL.

Since the described embodiment of the present invention contemplates a capacitor bank having 15 matched capacitors, the middle value of capacitance is approximately achieved when 8 of the 15 capacitors are coupled to the voltage controlled oscillator. Thus, once the finite state machine, e.g., finite state machine 504 of FIG. 5, receives the start calibration signal from the baseband processor, it generates a calibration output, as suggested in column 604, row 612, to prompt 8 of the capacitors to be selectively coupled. Thereafter, after the "lock time to settle" signal is no longer set, meaning that sufficient time has elapsed for the VCO of FIG. 4 to settle at the new voltage level, the numbers of capacitors that are switched in or out depend on whether the charge pump feedback bias voltage level is too high or too low. If, for example, the voltage level is still too low, then the value indicated in column 604, row 616 is used to specify the number of capacitors that are to be coupled. Here, that number is equal to the decimal number 12, or the digital number 1100. Thereafter, in a similar manner, the values of rows 620 and 624 are generated by the finite state machine for the calibration output to set either 14 or 15 capacitors, according to whether the voltage value is still too low after the "lock time to settle" signal is received after a calibration step.

Similarly, if the voltage level is too high after the calibration output is set to the value of row 612, the numbers of capacitors in the circuit that are coupled are reduced in a similar fashion. More specifically, column 608, row 616 illustrates that in the next step, only 4 capacitors are to be selectively coupled. Rows 620 and 624 suggest that either 2 or only 1 capacitor is to be selectively coupled to reduce the VCO input voltage level and corresponding output frequency as needed. It is interesting to note that at least one of the 15 capacitors will always be set in this described embodiment of the invention. In an alternate embodiment, all 15 capacitors may be switched out of selective coupling with the phased-locked loop circuitry.

Figure 7:
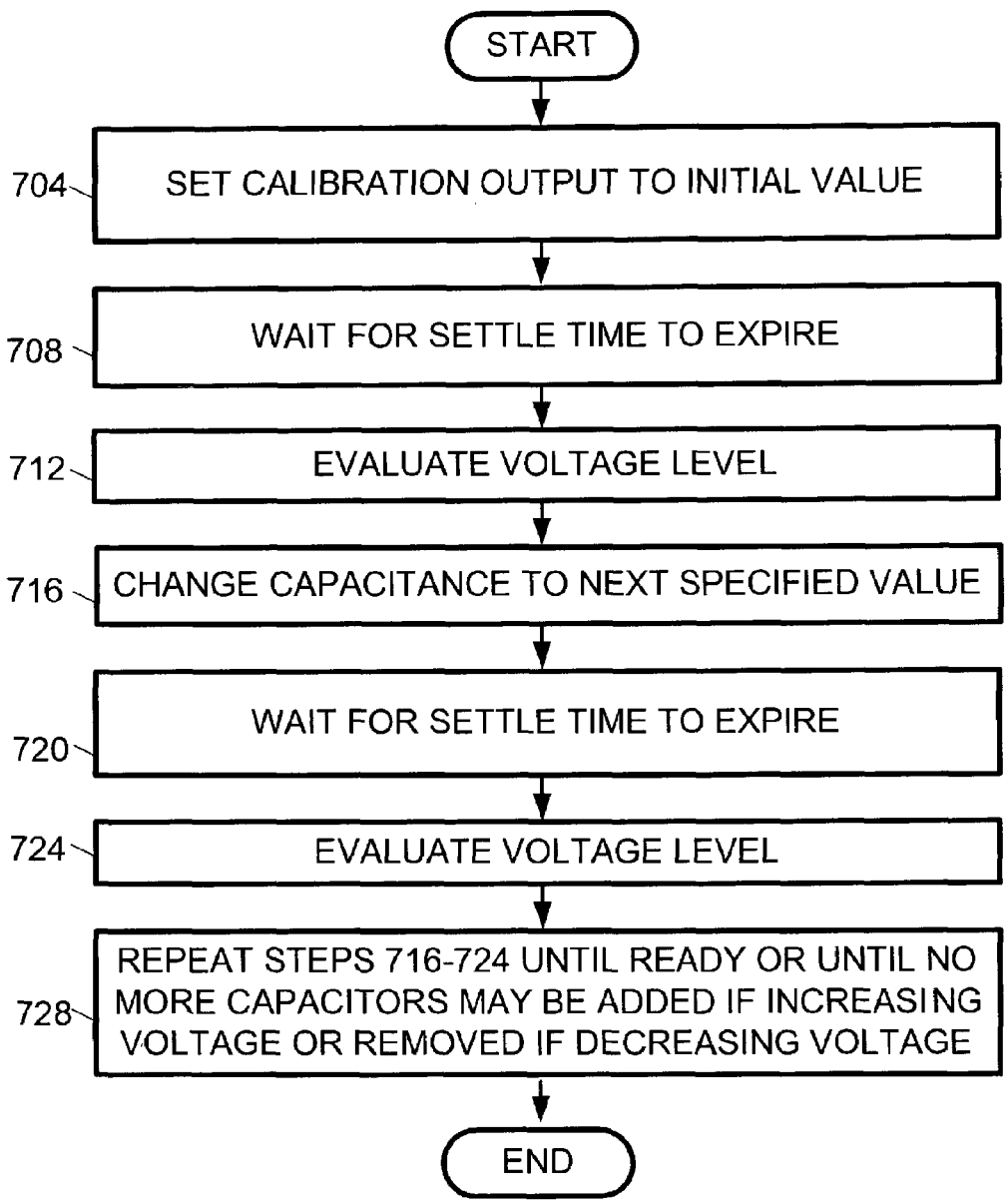
FIG. 7 is a flowchart that illustrates a method for setting a control voltage for a voltage control oscillator and, more specifically, for adjusting an output frequency of a phase-locked loop, according to one embodiment of the present invention.

FIG. 7 is a flowchart that illustrates a method for setting a control voltage for a voltage controlled oscillator and, more specifically, for adjusting an output frequency of a phase-locked loop, according to one embodiment of the present invention. The method of FIG. 7 is explained in relation to a finite state machine formed within a voltage controlled oscillator calibration circuit, for example, voltage controlled oscillator calibration circuit 324 of FIG. 3. It is understood, of course, that the inventive method may be performed entirely within a phase-locked loop in an alternate embodiment. In general, the invention comprises a method for adjusting a voltage controlled oscillator input voltage level to control a frequency output of a phase-locked loop therefrom.

Initially, a finite state machine within a voltage controlled oscillator calibration circuit sets a calibration output signal to an initial value (step 704). In the described embodiment of the invention, the initial value is one that results in approximately half of all of the capacitors of a capacitor array being selectively coupled to affect the frequency being produced by the voltage controlled oscillator, for example, a voltage controlled oscillator formed within phase-locked loop circuit 320 of FIG. 3. Because the described embodiment of the invention comprises a capacitor array that includes 15 capacitors, the initial value is set to 8 (meaning 8 capacitors are selectively coupled to the phase-locked loop circuit) as was shown in relation to row 612 of FIG. 6. After the calibration bits have been set to an initial value, thereby specifying a number of capacitors that are operably coupled to affect the frequency output of the phase-locked loop, the inventive method includes waiting for a settle time to expire (step 708). In the described embodiment of the invention, neither the finite state machine nor the voltage controlled oscillator calibration circuit include an internal clock or associated logic. Accordingly, the finite state machine waits for a control signal that is generated by an external source, e.g., the baseband processor in the described embodiment, that advises when a settle time has elapsed and the process may be continued. Alternatively, however, logic circuitry that provides for determining when a settle time has expired may readily be formed within the finite state machine.

As was described before, in one embodiment of the invention, a signal labeled "lock time to settle" is received from the external baseband processor indicating that the settle time has expired. Once the settle time has expired and the finite state machine no longer needs to wait as specified in step 708, the finite state machine evaluates the voltage level as defined by a charge pump feedback bias signal produced by the combination of the charge pump and loop filter (step 712). As was described before, a charge pump feedback bias signal is evaluated, which charge pump feedback bias signal is extracted from a node within the loop filter to determine the output voltage level of the combination of the charge pump and loop filter. This charge pump feedback bias signal is produced to a plurality of comparators that perform a comparison of the charge pump feedback bias signal to a plurality of threshold values to determine whether the voltage is within a specified range. The finite state machine receives the outputs of each of the plurality of comparators to determine the results and, more specifically, whether, and how, a voltage input to a VCO should be coarsely adjusted.

Accordingly, the step of evaluating the voltage level includes, in the described embodiment, the steps of receiving the charge pump feedback bias signal at a plurality of comparators, reading the output of the plurality of comparators, for example, comparators 512 through 524 of FIG. 5, and evaluating the received comparator outputs. If the voltage level is not within the low and high thresholds, meaning that it is either too high or too low, the capacitance is changed to the next specified value (step 716). In the described embodiment of the invention, if the voltage is too low, then the capacitance is changed by adding 4 additional capacitors, as specified in row 616, column 604 of FIG. 6.

If the voltage is too high, then 4 capacitors are removed, as is shown in row 616, column 608 of FIG. 6. Once the capacitance has been changed (the number of selectively coupled capacitors has been changed to a value reflected in the table of FIG. 6, for example) to the next specified value according to the evaluated voltage level, the finite state machine must again wait until it receives the "lock time to settle" control signal from the baseband processor in the described embodiment of the present invention (step 720). Thereafter, the voltage level is evaluated again (step 724).

In general, steps 716 through 724 are repeated until a ready indication is received or until there are no more capacitors that may be added if the voltage level is being increased or removed if the voltage level is being decreased to bring it within tolerance (step 728). Once the calibration process is completed, if the voltage level is not within a specified or acceptable range, the finite state machine generates an error flag.

Figure 8:
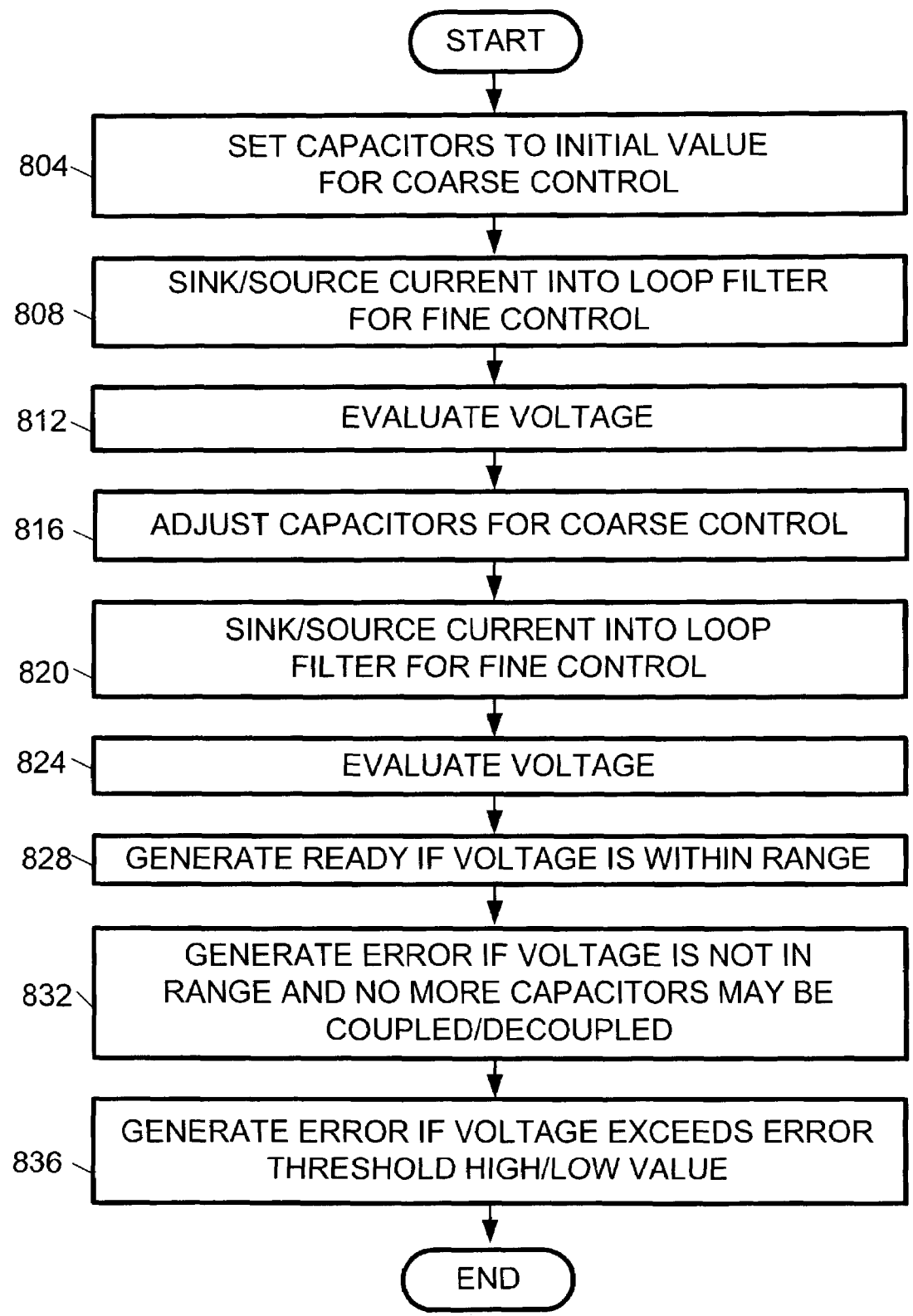
FIG. 8 is a flowchart that illustrates one embodiment of the present invention.

FIG. 8 is a flowchart that illustrates one embodiment of the present invention. More specifically, the method of FIG. 8 is a method for adjusting the capacitance within a phase-locked loop thereby adjusting the output voltage of an internal charge pump and loop filter combination and therefore a frequency of oscillation produced by the phase-locked loop. Initially, the method includes setting the total selectable capacitance to an initial value for coarse adjustment of an output frequency and corresponding voltage controlled oscillator input voltage control (step 804). In the described embodiment, the initial value is 8, meaning that 8 of 15 capacitors are operatively coupled to affect the output voltage of the charge pump and loop filter, and therefore the VCO tuning, of the phase-locked loop, as shown in FIGS. 3 and 4. Once the capacitance has been set to an initial value in step 804, then the charge pump of the internal phase-locked loop either sinks or sources current from the loop filter coupled to the output stage of the charge pump, for example, as shown in FIG. 4, to provide fine control of the voltage that is fed into the voltage controlled oscillator (step 808). Thereafter, the voltage level extracted from the loop filter, for example, from node 428 of the loop filter of FIG. 4, is evaluated to determine whether it is within a specified voltage range (step 812). Once the voltage level has been evaluated, the total selectable capacitance of the voltage controlled oscillator is adjusted by adding or removing capacitors, if necessary.

In general, the step of adjusting the total capacitance includes adding half of the remaining capacitors if the voltage is being increased or removing half of the coupled capacitors if the voltage level is being decreased every time an adjustment step occurs. This provides a coarse voltage and corresponding frequency adjustment. Once the capacitance has been changed by changing the number of selectively coupled capacitors, the charge pump again sinks or sources current into the loop filter to provide a fine level of control or adjustment to the output voltage that is produced to the voltage controlled oscillator (step 820). Again, the voltage is evaluated as before (step 824). During this process, at each evaluation step, for example, steps 812 and 824, the finite state machine performing the method of FIG. 8 generates a ready signal if the voltage is within a specified range (step 828). The finite state machine, on the other hand, generates an error signal if the voltage is not within the specified range and no more capacitors may be selectively coupled or decoupled from the phase-locked loop (step 832). Additionally, in the described embodiment of the invention, the finite state machine generates an error flag if the voltage exceeds either a high error threshold voltage level or a low error threshold voltage level (step 836).

As may be seen, the method of FIG. 8 generally includes a two-step process that is repeated multiple times to calibrate the frequency of oscillation produced by phase-locked loop. Initially, a number of capacitors are set to provide an initial frequency of oscillation and then the output voltage of the charge pump and loop filter combination is adjusted by sinking or sourcing current from the loop filter by the charge pump. The sinking or sourcing of current from and into the loop filter provides a fine degree of adjustment while changing the number of selectively coupled capacitors provides a coarse degree of adjustment. If the voltage level is still not within a specified threshold, the process is repeated wherein a coarse adjustment is made and then is followed by a fine adjustment.

Figure 9A:
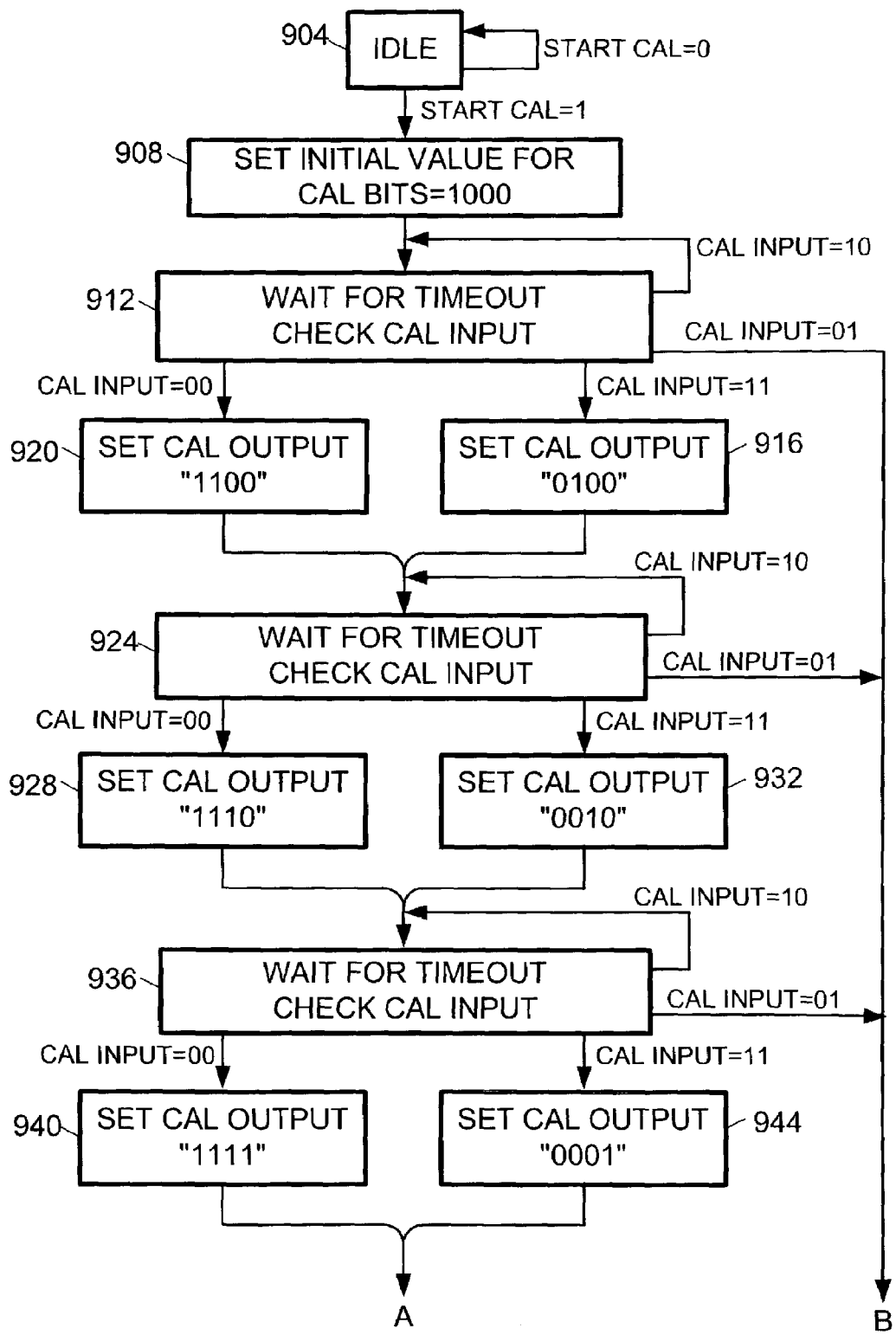
FIGS. 9A and 9B are flowcharts that illustrate a specific embodiment of the present invention for adjusting an output frequency of a phase-locked loop and, more specifically, for adjusting an input voltage of a voltage controlled oscillator of the phase-locked loop according to one embodiment of the present invention.
Figure 9B:
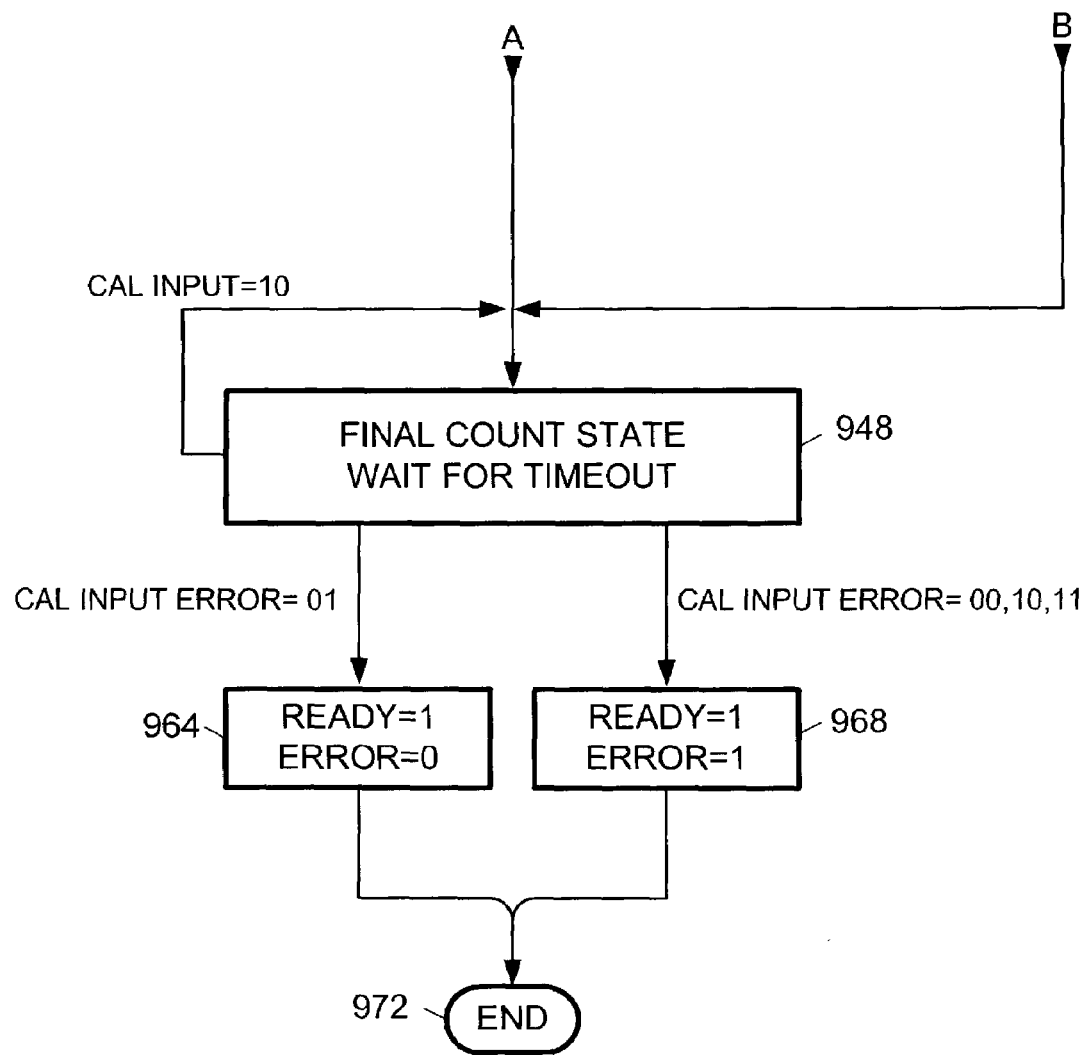

FIGS. 9A and 9B are flowcharts that illustrate a specific embodiment of the present invention for adjusting an output frequency of a phase-locked loop and, more specifically, for adjusting an input voltage of a voltage controlled oscillator of the phase-locked loop according to one embodiment of the present invention. Moreover, the method of FIGS. 9A and 9B may be understood if viewed in relation to FIGS. 4, 5 and 6 although the embodiments of FIGS. 4, 5 and 6 are not intended to limit the scope of the invention. Initially, with respect to the inventive method, the method is idle meaning it is not performed until a control signal is received from a baseband processor indicating that calibration is to be performed (step 904). Once a control signal is received from the external baseband processor indicating that calibration should be performed, the method includes setting the initial value of the calibration output bits to "1000" (step 908). As was explained before, this setting of the calibration output bits reflects that 8 of 15 capacitors of the described embodiment are to be operatively coupled to coarsely adjust the voltage produced to the input of the voltage controlled oscillator. This adjustment occurs prior to the fine adjustment that is performed by the combination of the charge pump and loop filter of the phase-locked loop in the described embodiment of the invention.

In the described embodiment of the invention, the calibration output signal is a 15-bit-wide signal wherein each bit is for controlling a digital switch to selectively couple a capacitor. The present method is explained in terms of digital numbers that represent the number of capacitors that are to be selectively coupled. Additional logic (not shown) converts the digital number into a corresponding number of bits of a 15-bit-wide signal that are set to a logic "1" to selectively couple corresponding capacitors. Accordingly, since the initial value is to be set to 8, the most significant bit, namely, bit 3, is set to a logic 1 and the calibration output signal is transmitted to selectively couple a corresponding number of capacitors in a PLL. The invention further includes waiting until a settle time has elapsed, as indicated by a control signal received from the baseband processor, namely, the "lock time to settle" signal in the described embodiment of the present invention (step 912).

Moreover, step 912 includes examining the outputs of the plurality of comparators, especially comparators 512 and 516 of FIG. 5, to see if they define a "01" bit pattern, meaning that the voltage is lower than a high threshold voltage and higher than a low threshold voltage after a settle time has elapsed. If the bit pattern from comparators 512 and 516, in the described embodiment of the invention, is a "01", then the calibration process is complete and a ready flag is generated to enable the phase-locked loop to transition from calibration mode to a normal operational mode. If the bit pattern from comparators 512 and 516 is not "01", then one of two process steps is performed. If the bit pattern is a "11", meaning that the voltage level is too high (higher than the high threshold), then the calibration output signal is set to "0100" to reduce the number of selectively coupled capacitors (step 916). If the output of the comparators is "00", the voltage level is too low (lower than the low threshold) and therefore must be increased. Accordingly, bits 3 and 2 of the calibration output signal are set to a logic 1 (step 920). Thus, finite state machine generates a "1100" in the calibration output signal to increase the number of selectively coupled capacitors.

In the case where the calibration input from comparators 512 and 516 is a "11", the voltage level is too high and the calibration output signal is set to a "0100", which means that bit 3 is changed from a logic 1 to a logic 0 (from the initial calibration step), and bit 2 is changed from a logic 0 to a logic 1. Effectively, the change in the output may be viewed as a right shift of the initial setting effectively dividing by 2. As was shown in relation to FIG. 6, if the voltage level is too high, half of the selectable capacitors are to be removed from the circuit. Accordingly, while 8 capacitors were initially selectively coupled to the voltage controlled oscillator, step 916 dictates that only 4 capacitors should be selectively coupled.

Once the capacitance value has been adjusted either at step 916 or step 920, and the calibration output signal has been transmitted, the invention includes waiting for the settle time to expire and then reexamining the calibration inputs (step 924). The calibration process is terminated if the calibration input bit pattern is equal to "01", indicating the control voltage is within the limits. If the calibration inputs are "00", the voltage level is still too low and the calibration output signal is set to "1110" (step 928). If, on the other hand, the calibration input signal from comparators 512 and 516 is equal to "11", then the voltage level is still too high and the calibration output signal is right shifted one more time or, alternatively, calibration output signal is set to "0010" (step 932).

Once again, after the calibration output signal has been generated and the settle time has expired after a corresponding number of capacitors are selectively coupled, the invention includes checking the calibration inputs again (step 936). If the calibration input bit pattern from comparators 512 and 516 is equal to "01", the calibration process is terminated and the ready flag is set. If the calibration input signal from comparators 512 and 516 is equal to a "00", the calibration output signal is set to a "1111" (step 940). If the calibration input from comparators 512 and 516 is equal to a "11", then the opposite happens. More specifically, the calibration output signal is set to "0001", meaning that only one capacitor is selectively coupled to the voltage controlled oscillator (step 944). Thereafter, as expected, the calibration output signal is transmitted and the system waits for the settle time to expire.

After either step 940 or step 944, and the calibration output are transmitted to the voltage controlled oscillator, the invention includes waiting for settle time to expire and rechecking the calibration input for a final time (step 948). Again, if the calibration input value is equal to "01", the voltage is within the specified voltage thresholds and the calibration process is terminated. If, however, the calibration input is equal to "00" or "11", meaning the voltage is still too low or too high, respectively, then the error signal is set to a logic 1 and the ready signal is set to a logic 1 also (step 968). Thereafter, the calibration process is terminated. In the described embodiment of the invention, "ready" is set to a logic "1" whenever the calibration process has reached a conclusion even if successful calibration was not achieved.

Figure 10:
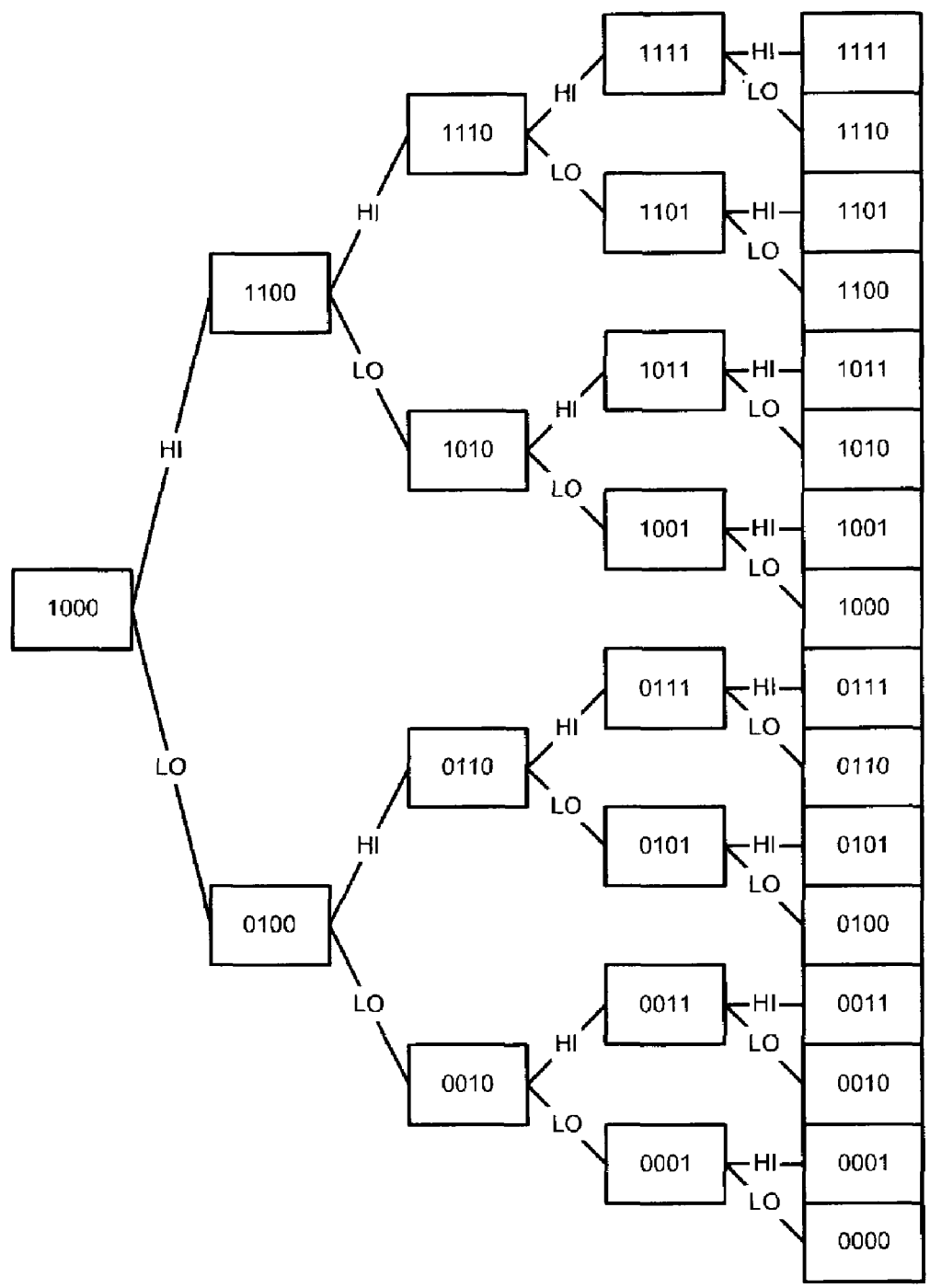
FIG. 10 is a diagram illustrating a binary search pattern operating according to one embodiment of the present invention.

FIG. 10 is a diagram illustrating a binary search pattern operating according to one embodiment of the present invention. The calibration routine determines the best switch capacitance code (cap code) as a function of the control voltage (vc) threshold band. The calibration routine ends if the cap code sets control voltage vc within the two threshold levels. If none of the cap codes correspond to a control voltage vc value within the two threshold levels, then the best code closest to the threshold band is chosen as per the binary search tree shown in FIG. 10. This calibration routine would function in a similar manner if only one threshold value was provided as well. The READY is set once calibration has ended. The ERROR flags are set if calibration ends with a cap code that is in the error range based on the two error threshold indicators.

The invention disclosed herein is susceptible to various modifications and alternative forms. Specific embodiments therefore have been shown by way of example in the drawings and detailed description. For example, while the described invention includes a finite state machine formed within the inventive circuitry, an alternate embodiment includes placing at least a portion of the logic of the finite state machine within the baseband processing circuitry. Alternatively, a portion of the logic relating to the operation of initiating and controlling the calibration process that is presently performed by the baseband processor may be defined by logic circuitry formed within the finite state machine or, more generally, within any circuitry formed as a part of the inventive phase-locked loop circuitry. It should be understood that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A phase-locked loop system formed within a radio receiver, comprising: a phase-locked loop circuit for providing a signal having a specified frequency characteristic; a voltage controlled oscillator calibration circuitry for providing a calibration output signal to the phase-locked loop circuit that specifies how many selectable capacitors of a plurality of capacitors formed within the phase-locked loop circuit are to be selectively coupled to a node within the phase-locked loop circuit while the phase-locked loop system is operating in a calibration mode; wherein the voltage controlled oscillator calibration circuitry further includes a finite state machine is coupled to receive a first control signal and is formed to initiate a calibration process whenever the first control signal is received; and wherein the voltage controlled oscillator calibration circuitry further includes a plurality of comparators, the plurality of comparators being coupled to receive a VCO voltage and each coupled to receive one of a plurality of threshold voltages for comparing to the VCO voltage.

2. The phase-locked loop system of claim 1 wherein the finite state machine coupled to receive an output from each of the plurality of comparators, the finite state machine for determining whether the VCO voltage is within the plurality of threshold voltages.

3. The phase-locked loop system of claim 2 wherein the finite state machine includes logic to determine that the VCO voltage is too high if a received output from a first comparator is a logic "1" and logic to determine that the VCO voltage is too low if a received output from a second comparator is a logic "0".

4. The phase-locked loop system of claim 1 wherein the state machine is coupled to receive a second control signal for specifying when a settle time has expired.

5. The phase-locked loop system of claim 1 further including logic for generating a calibration output signal that defines how many selectable capacitors are to be coupled to the phase-locked loop circuit of the phase-locked loop system.

6. The phase-locked loop system of claim 1 further including logic to generate a control signal indicating that the phase-locked loop circuit is calibrated whenever the finite state machine has received an indication from the plurality of comparators that the VCO voltage is lower than a high threshold voltage and higher than a low threshold voltage.

7. The phase-locked loop system of claim 1 further including logic to generate an error flag whenever a total number of selectable capacitors has been selectively coupled to the phase-locked loop system and the finite state machine still has not received an indication from the plurality of comparators that the VCO voltage is within the voltage range.

8. The phase-locked loop system of claim 1 further including logic to generate an error flag whenever a total number of selectable capacitors have been removed and the finite state machine still has not received an indication from the plurality of comparators that the VCO voltage is within the voltage range.

9. The phase-locked loop system of claim 1 wherein the phase-locked loop circuit includes an array of selectable capacitors formed within and as a part of the phase-locked loop circuit.

10. The phase-locked loop system of claim 9 wherein the phase-locked loop circuit further includes a phase frequency detector coupled in series with a charge pump which, in turn, is coupled with a loop filter which, in turn, is coupled with a voltage controlled oscillator.

11. The phase-locked loop system of claim 10 wherein the phase-locked loop circuit further includes a frequency divider coupled in a feedback loop from an output of the voltage controlled oscillator to an input of the phase frequency detector whereby the frequency divider receives a signal having an output frequency from the voltage controlled oscillator that is approximately equal to the specified frequency characteristic and divides the output frequency from the voltage controlled oscillator by an integer number to create a signal with a new frequency characteristic that corresponds to the result of dividing the output frequency by the integer number.

12. The phase-locked loop system of claim 1 wherein the voltage controlled oscillator calibration circuitry further includes logic to couple approximately half of a number of selectable capacitors to the phase-locked loop circuit in an initial adjustment step.

13. The phase-locked loop system of claim 12 further comprising logic to increase the capacitance value of the phase-locked loop circuit by selectively coupling approximately half of a remaining number selectable capacitors that are not selectively coupled to the phase-locked loop circuit.

14. The phase-locked loop system of claim 12 wherein the voltage controlled oscillator calibration circuitry further includes logic to decouple approximately half of the selectively coupled capacitors that are coupled to the phase-locked loop circuit.

15. A phase-locked loop circuit, comprising: a phase frequency detector for detecting a phase difference between a reference input signal and a feedback signal for producing a voltage that represents the detected phase difference; a charge pump coupled to receive the voltage representing the detected phase difference, the charge pump for generating a DC current level responsive to the received voltage: a loop filter coupled to receive the DC current generated by the charge pump, the loop filter for converting the received current into a voltage level; a voltage controlled oscillator coupled to receive the voltage level, the voltage controlled oscillator for producing an output signal having a frequency characteristic which frequency characteristic is a function of the received voltage level; and an array of selectable capacitors formed within the phase-locked loop circuit, the selectable capacitors for adjusting the frequency characteristic of the output signal from the phase-locked loop circuit.

16. The phase-locked loop circuit of claim 15 further comprising a frequency divider to convert the output signal from the voltage controlled oscillator having the frequency characteristic into the feedback signal having a frequency characteristic that approximately equals a frequency characteristic of a reference input signal.

17. The phase-locked loop circuit of claim 15 wherein the array of selectable capacitors are coupled to receive a plurality of control lines from a voltage controlled oscillator calibration circuit, the plurality of control lines for controlling which of the selectable capacitors of the array of selectable capacitors are selectively coupled to the phase-locked loop circuit.

18. The phase-locked loop circuit of claim 17 wherein the phase-locked loop circuit is coupled to receive one control line for every selectable capacitor.

19. A method for controlling a frequency of an output signal of a phase-locked loop circuit, comprising: setting a capacitance value by selecting a first number of capacitors formed within the phase-locked loop circuit to provide a level of coarse frequency-control; sinking current out of a loop filter formed within the phase-locked loop circuit to provide fine frequency control whenever an input voltage to a voltage controlled oscillator is higher than a specified amount; sourcing current into the loop filter for fine frequency control whenever the input voltage to a voltage controlled oscillator is lower than a specified amount; evaluating a voltage at a node within the loop filter to determine whether the voltage within a specified threshold range; and generating a ready control signal if the voltage is within the specified threshold range generating an error signal if the voltage is not within the specified threshold range and no capacitors may be coupled or decoupled to and from the phase-locked loop circuit..

20. The method of claim 19 wherein capacitors are selectively coupled and selectively decoupled from a node within the phase-locked loop circuit according to whether the voltage from the node within the loop filter was below a specified threshold range or above the specified threshold range.

21. The method of claim 20 wherein current is sourced or sinked from the loop filter for fine frequency control after selectable capacitors have been added or removed from coupling to the phase-locked loop circuit.

* * * * *

UNITED STATES PATENT AND TRADEMARK OFFICE
CERTIFICATE OF CORRECTION

PATENT NO. : 7,120,412 B2  
APPLICATION NO. : 10/303384  
DATED : October 10, 2006  
INVENTOR(S) : Seema Butala Anand Page 1 of 1

It is certified that error appears in the above-identified patent and that said Letters Patent is hereby corrected as shown below:

In the Claims

Col. 18, line 52, in claim 1: after "finite state machine" replace "is coupled" with --that is operably coupled--
Col. 18, line 53, in claim 1: replace "and is formed" with --and is operable--
Col. 19, line 5, in claim 4: before "state machine" insert --finite--
Col. 19, line 61, in claim 13: after "half of a remaining number" insert --of--
Col. 20, line 14, in claim 15: after "received voltage level;" insert --voltage controlled oscillator calibration circuitry further including a finite state machine that is operably coupled to receive a first control signal and is operable to initiate a calibration process whenever the first control signal is received;--
Col. 20, line 17, in claim 15: after "phase-locked loop circuit" insert --, based upon control signals provide by the voltage controlled oscillator calibration circuitry--
Col. 20, line 41, in claim 19: replace "frequency-control" with --frequency control--
Col. 20, line 49, in claim 19: after "whether the voltage" insert --is--
Col. 20, line 51, in claim 19: after "threshold range" insert --and--
Col. 20, line 53, in claim 19: before "capacitors" insert --more--

Signed and Sealed this
Sixteenth Day of July, 2013

Teresa Stanek Rea
*Acting Director of the United States Patent and Trademark Office*